United States Patent
Muroya

(10) Patent No.: US 6,577,660 B1
(45) Date of Patent: Jun. 10, 2003

(54) DISTRIBUTED FEEDBACK TYPE SEMICONDUCTOR LASER DEVICE HAVING GRADUALLY-CHANGED COUPLING COEFFICIENT

(75) Inventor: Yoshiharu Muroya, Tokyo (JP)

(73) Assignee: NEC Corporation, Tokyo (JP)

( * ) Notice: Subject to any disclaimer, the term of this patent is extended or adjusted under 35 U.S.C. 154(b) by 11 days.

(21) Appl. No.: 09/621,690

(22) Filed: Jul. 21, 2000

(30) Foreign Application Priority Data

Jul. 22, 1999 (JP) .......................................... 11-207077

(51) Int. Cl.[7] .............................................. H01S 3/085
(52) U.S. Cl. .......................................... 372/45; 372/46
(58) Field of Search .............................. 372/96, 92, 44, 372/102, 45

(56) References Cited

U.S. PATENT DOCUMENTS

| | | | | |
|---|---|---|---|---|
| 4,719,636 A | * | 1/1988 | Yamaguchi | 372/20 |
| 4,908,833 A | * | 3/1990 | Chraplyvy et al. | 359/173 |
| 5,040,188 A | * | 8/1991 | Lang et al. | 372/45 |
| 5,353,298 A | * | 10/1994 | Makuta | 372/46 |
| 5,848,207 A | * | 12/1998 | Uetsuka et al. | 385/37 |
| 6,064,685 A | * | 5/2000 | Bissessur et al. | 359/572 |
| 6,111,906 A | * | 8/2000 | Muroya | 372/96 |

FOREIGN PATENT DOCUMENTS

| | | |
|---|---|---|
| EP | 0 567 406 A1 | 10/1993 |
| EP | 732 783 A1 | 9/1996 |
| EP | 0 814 547 A1 | 12/1997 |
| JP | 2-280394 | 11/1990 |
| JP | 3-110885 | 5/1991 |
| JP | 5-136521 | 6/1993 |
| JP | 8-255954 | 10/1996 |
| JP | 9-64456 | 3/1997 |
| JP | 10-223967 | 8/1998 |
| JP | 10-256653 | 9/1998 |
| JP | 11-163464 | 6/1999 |
| JP | 11 163 464 A | 6/1999 |

OTHER PUBLICATIONS

Soda, H. et al.: "GAINASP/INP Phase–adjusted Distributed Feedback Lasers with a Step–Like Nonuniform Stripe width Structure" Electronics Letters, GB, IEE Stevenage, vol. 20, No. 24, Nov. 22, 1984, pp. 1016–1018, XP000709944, ISSN: 0013–5194.

Albrektsen, O. et al: "Gratings for Distributed Feedback Lasers Formed by Selective Expitaxial Growth" Proceedings of the International Conference on Indium Phosphide and Related Materials, US, New York, IEEE, vol. CONF. 6, Mar. 27, 1994, pp. 607–610, XP000473943, ISBN: 0–7803–1476–X.

Morthier,, G. et al.: "A new DFB–Laser Diode with Reduced Spatial Hole Burning" IEEE Photonics Technology Letters, US, IEEE, Inc., New York, col. 2, No. 6, Jun. 1, 1990, pp. 388–390 XP000147992, ISSN: 1041–1135.

K. Utaka et al., "$\lambda/4$–Shifted InGaAsP/InP DFB Lasers", IEEE Journal of Quantum Electronics, vol. QE–22, No. 7, Jul. 1986, pp. 1042–1051.

\* cited by examiner

*Primary Examiner*—Paul Ip
*Assistant Examiner*—Dung Nguyen
(74) *Attorney, Agent, or Firm*—Sughrue Mion, PLLC

(57) ABSTRACT

In a distributed feedback type semiconductor laser device having a waveguide structure for outputting a signal light from a front side of the waveguide structure and a monitoring light from a rear side of the waveguide structure, an active layer is formed above a semiconductor substrate, and an optical guide layer having a diffraction grating is provided. A coupling coefficient of the waveguide structure is gradually increased from the front side of the waveguide structure to the rear side of the waveguide structure.

12 Claims, 17 Drawing Sheets

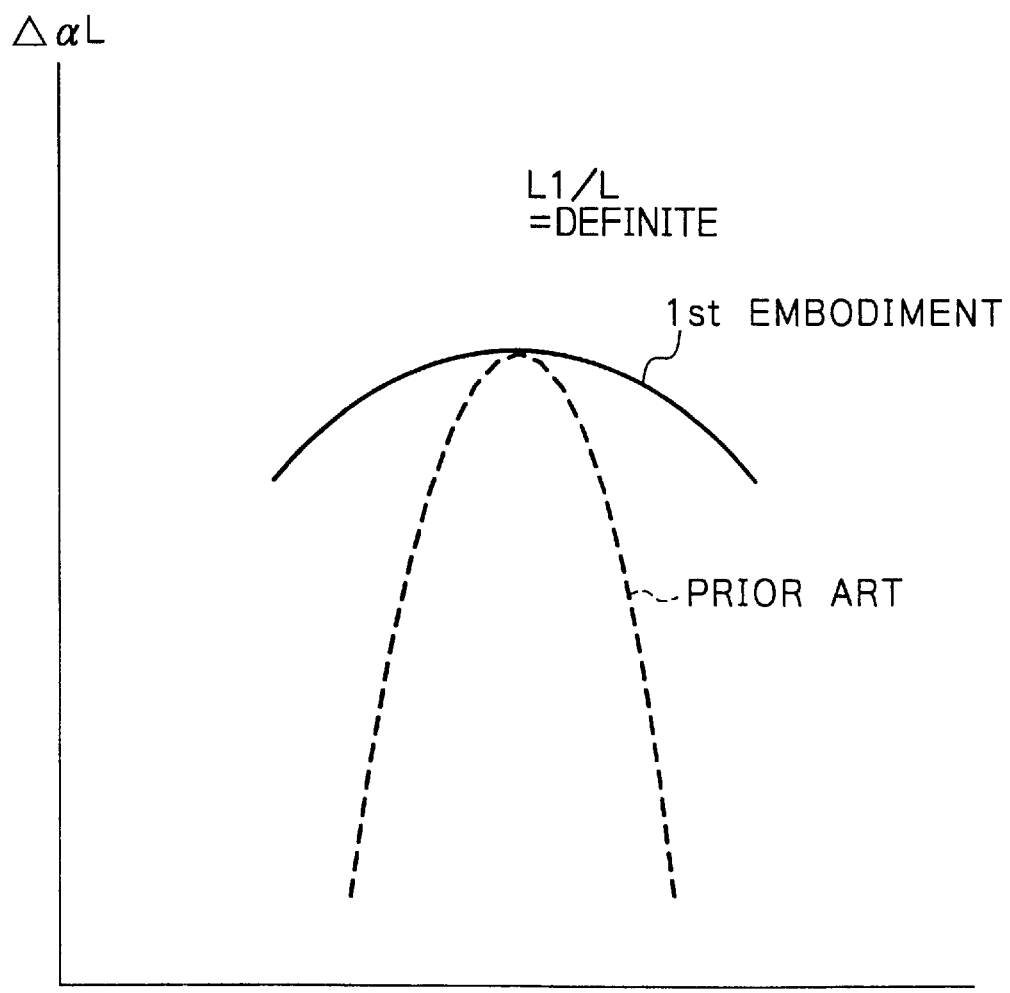

DISTRIBUTED FEEDBACK TYPE SEMICONDUCTOR LASER DEVICE HAVING GRADUALLY-CHANGED COUPLING COEFFICIENT

BACKGROUND OF THE INVENTION

1. Field of the Invention

The present invention relates to a distributed feedback (DFB) type semiconductor laser device such as a λ/4-shifted DFB type semiconductor laser device.

2. Description of the Related Art

In a λ/4-shifted DFB type semiconductor laser device, a λ/4 shift is located at the center of a waveguide, which can theoretically realize 100 percent yield single mode characteristics. If such a λ/4-shifted DFB type semiconductor laser device has an anti-reflection (AR) coating for outputting a signal light on the front side and an AR coating for outputting a monitoring light on the rear side, the output power of the signal light is theoretically the sane as the output power of the monitoring light. As a result, the light output characteristics of the signal light deteriorate.

In order to suppress the above-mentioned light output characteristics, in the prior art, a λ/4 shift is located on the rear side from the center of the waveguide (see JP-A-3-110885). This will be explained later in detail.

In the above-described prior art device, however, the coupling coefficient is rapidly changed in the waveguide. Therefore, the output power ratio of the signal light to the monitoring light has a severe trade-off relationship with the normalized threshold gain difference and the deviation of the λ/4 shift location. As a result, a margin or tolerance of the ratio of coupling coefficient on the front side to the coupling coefficient on the rear side is very small, which decreases the manufacturing yield.

In addition, a rapid change of the diffraction grating at the λ/4 shift location invites a rapid change in the equivalent refractive index of an optical waveguide layer, which deteriorates the single mode characteristics.

Further, in a high output mode, the Bragg oscillation condition is changed by the spatial hole burning phenomenon, so that a mode skip occurs.

Additionally, in the case where the phase shift location is definite, when the coupling coefficient ratio is changed, the normalized threshold gain difference greatly changes, so that stable single mode characteristics cannot be realized.

SUMMARY OF THE INVENTION

It is an object of the present invention to provide a DFB type semiconductor laser device capable of increasing the manufacturing yield, improving the single mode characteristics, and avoiding a mode skip due to the change of the Bragg condition.

According to the present invention, in a DFB type semiconductor laser device having a waveguide for outputting a signal light from a front side of the waveguide and a monitoring light from a rear side of the waveguide, an active layer is formed above a semiconductor substrate, and an optical guide layer having a diffraction grating is provided. A coupling coefficient of the waveguide is gradually increased from the front side of the waveguide to the rear side of the waveguide.

BRIEF DESCRIPTION OF THE DRAWINGS

The present invention will be more clearly understood from the description set forth below, as compared with the prior art, with reference to the accompanying drawings, wherein:

FIG. 10 is a graph showing the normalized threshold gain difference characteristics of the device of FIG. 6;

DESCRIPTION OF THE PREFERRED EMBODIMENTS

Before the description of the preferred embodiments, a prior art λ/4-shifted DFB type semiconductor laser device will be explained with reference to FIGS. 1, 2, 3 and 4 (see JP-A-3-110885)

Figure 1:
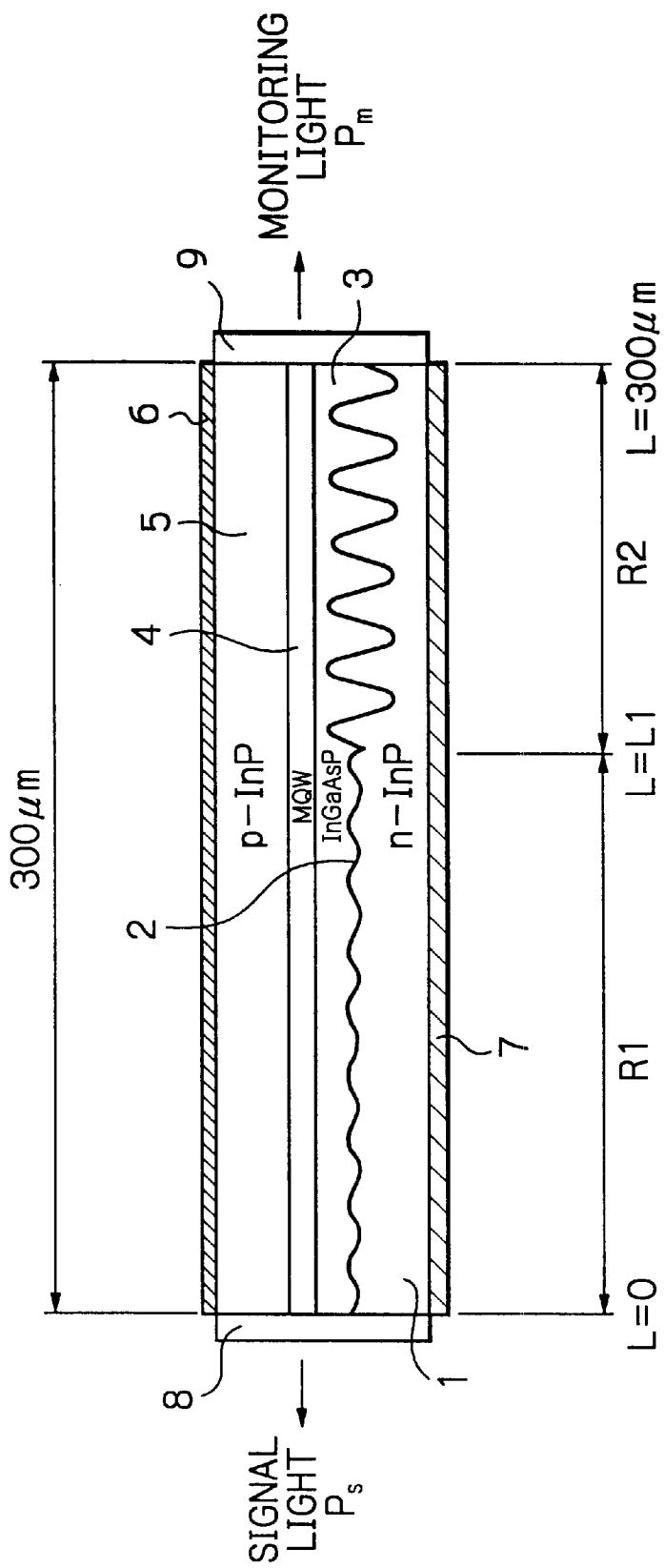
FIG. 1 is a cross-sectional view illustrating a prior art λ/4-shifted DFB type semiconductor laser device.

In FIG. 1, which illustrates a prior art λ/4-shifted DFB type semiconductor laser device, reference numeral 1 designates an n-type InP substrate on which a diffraction grating 2 for determining an oscillation wavelength is formed. Formed on the InP substrate i are an InGaAsP optical guide layer 3, an InGaAsP strained MQW active layer 4 and a p-type InP clad layer 5. The MQW active layer 4 is sandwiched by the InP substrate 1 and the InP clad layer 5 which have a large energy band gap, to form a double heterestructure. Also, a p-type electrode 6 and an n-type electrode 7 are formed on the InP clad latter 5 and the InP substrate 1, respectively. Further, an AR coating 8 is applied to a front facet of the device for outputting a signal light, and an AR coating 9 is applied to a rear facet of the device for outputting a monitoring light. In this case, the length of a cavity is 300 μm, for example.

Figure 2:
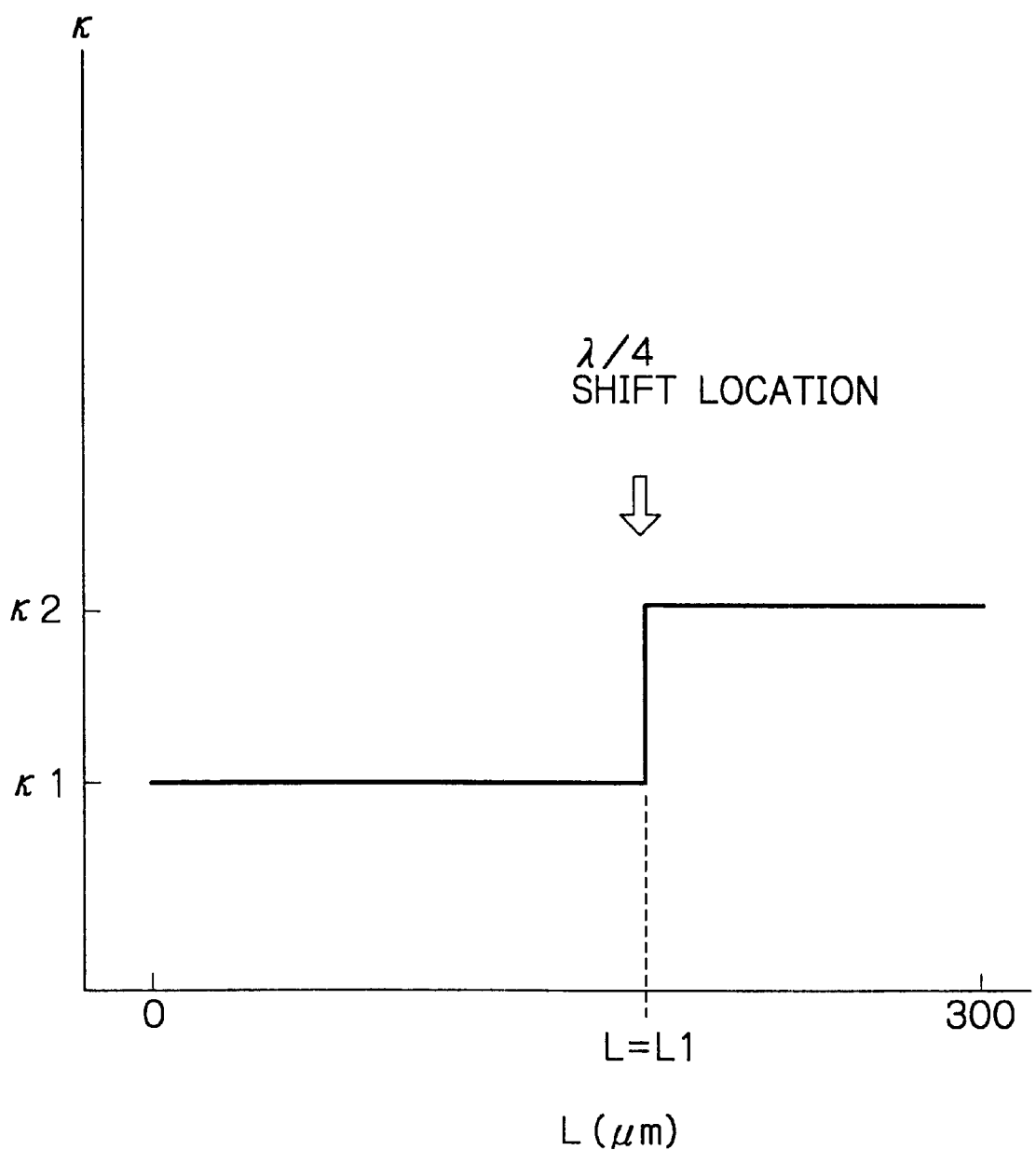
FIG. 2 is a graph showing the coupling coefficient of the device of FIG. 1.

The diffraction grating 2 has two regions R1 and R2 which have coupling coefficients κ1 and κ2, respectively, as shown in FIG. 2. Note that a coupling coefficient κ is defined by $$\kappa = \pi \cdot \Delta n / \lambda$$

where Δn is the difference in refractive index depending on the period of the diffraction grating 2; and λ is a Bragg wavelength is determined by the period of the diffraction grating 2, i.e., twice the period of the diffraction grating 2.

The boundary of the regions R1 and R2 of the diffraction grating 2 is located at L=L1 on the side of the facet 9 from the center of the cavity. The period of the diffraction grating 2 in the region R1 is shifted from the period of the diffraction grating 2 in the region R2 by κ/4.

Figure 3:
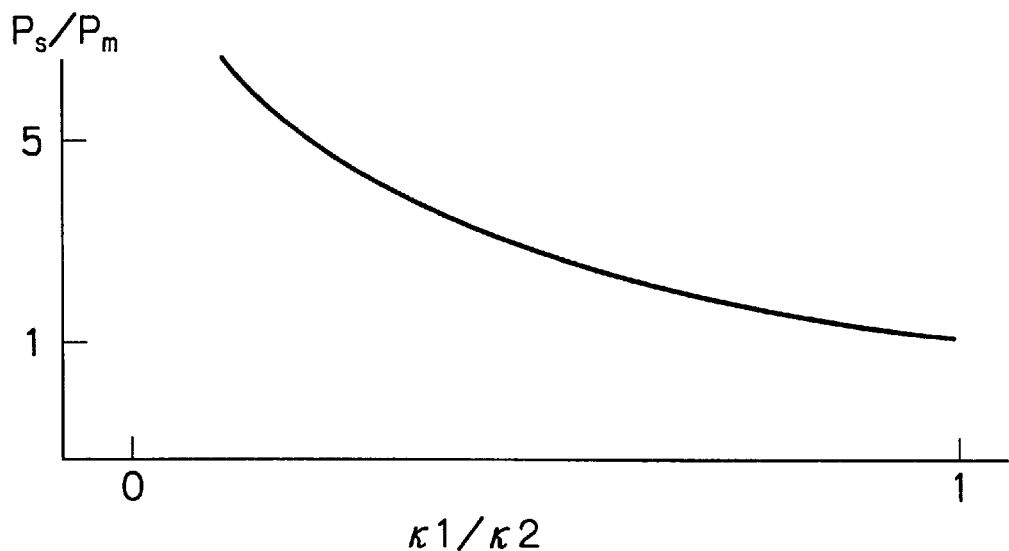
FIG. 3 is a graph showing the relationship between the coupling coefficient ratio and the power output ratio of the device of FIG. 1.
Figure 4:
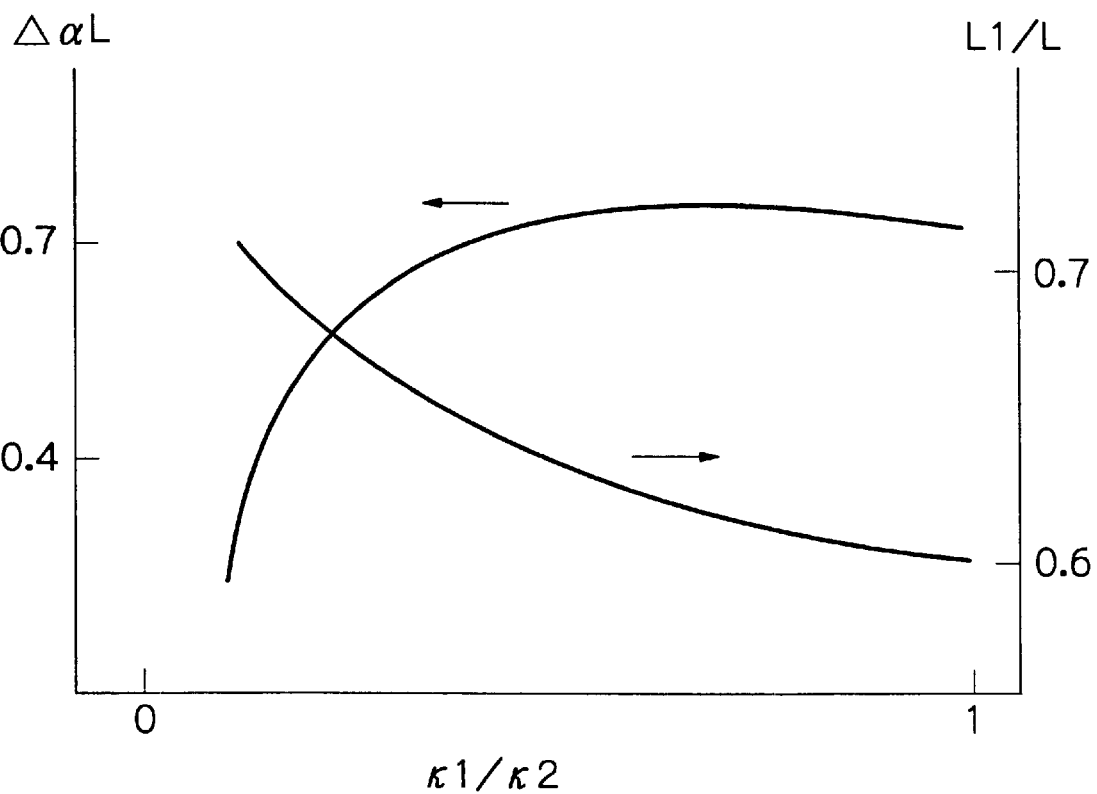
FIG. 4 is a graph showing the normalized threshold gain difference characteristics and the λ/4 shift normalized location characteristics of the device of FIG. 1.

In the λ/4-shifted DFB semiconductor laser device of FIG. 1, as shown in FIG. 3, the smaller the ratio of the coupling coefficient κ1 of the region R1 to the coupling coefficient κ2 of the region R2, the larger the ratio of the power $P_s$ of the signal light to the power $P_m$ of the On the other hand, in FIG. 4, which is a graph showing the normalized threshold gain difference ΔαL and the normalized location L1/L of a λ/4 shift with respect to the coupling coefficient κ1/κ2 of the device of FIG. 1, the larger the ratio of the coupling coefficient κ1 of the region R1 to the coupling coefficient κ2 of the region R2, the larger the normalized threshold gain difference ΔαL and the smaller the normalized location of the λ/4 shift from the center location of the cavity (L1/L=0.5).

As shown in FIGS. 3 and 4, the output power ratio $P_s/P_m$ has a severe trade-off relationship with the normalized threshold gain difference ΔαL and the normalized location of the λ/4 shift due to the rapidly-changed coupling coefficient κ as shown in FIG. 2. In other words, if the coupling coefficient ratio κ1/κ2 is small to increase the output power ratio $P_s/P_m$, the normalized threshold gain difference ΔαL becomes small and the normalized location of the λ/4 shift becomes large, which cannot realize stable single mode characteristics. For realizing optimum values of the output power ratio $P_s/P_m$, the normalized threshold gain difference ΔαL and the normalized location of the λ/4 shift, a margin or tolerance of the coupling coefficient ratio κ1/κ2 is very small, which decreases the manufacturing yield.

In addition, a rapid change of the diffraction grating 2 at the λ/4 shift location invites a rapid change in the equivalent refractive index of the InGaAsP optical waveguide layer 3, which deteriorates the single mode characteristics.

Further, in a high output mode, the Bragg oscillation condition is changed by the spatial hole burning phenomenon, so that a Node skip occurs.

Figure 5:
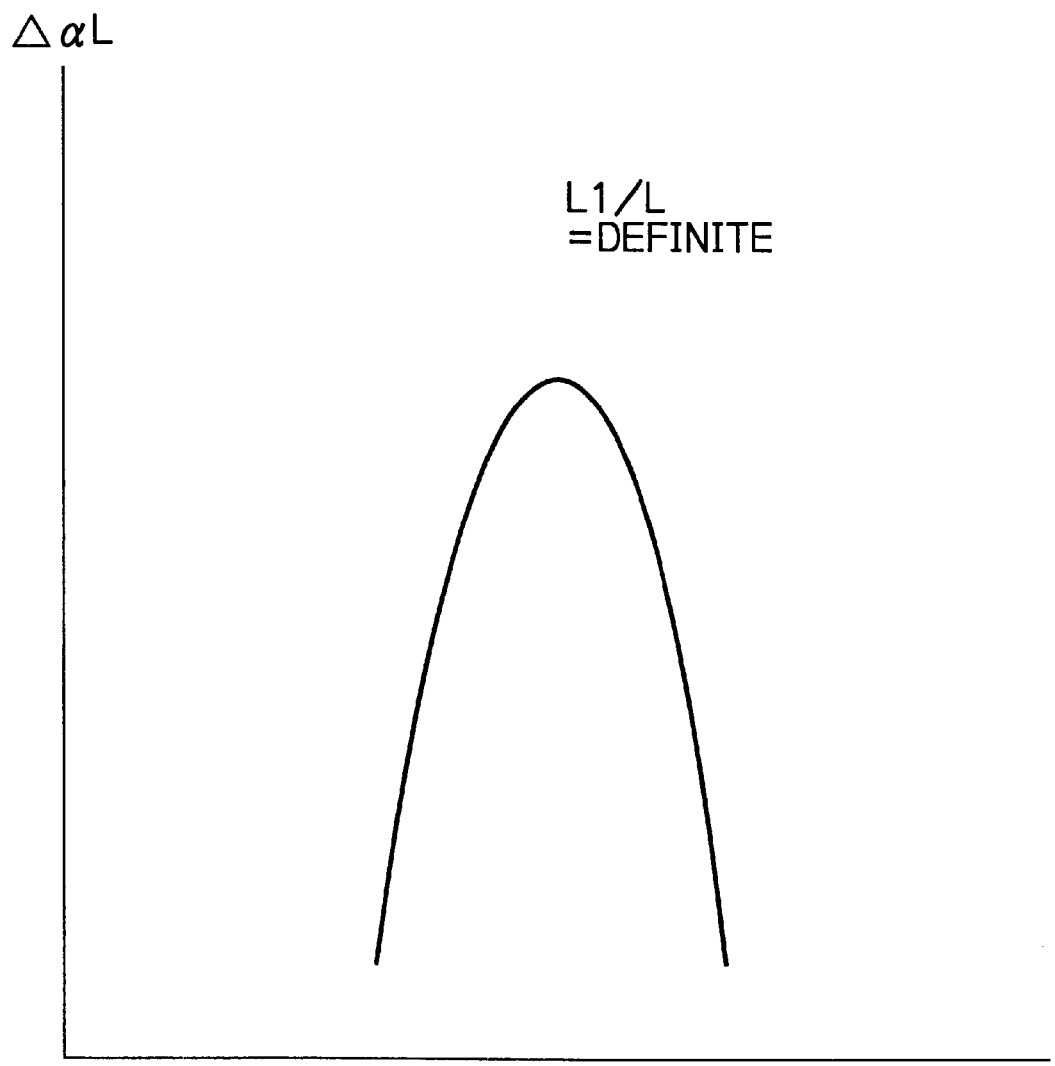
FIG. 5 is a graph showing the normalized threshold gain difference characteristics of the device of FIG. 1.

Additionally, as shown in FIG. 5, in the case where the normalized phase shift location L1/L is definite, when the coupling coefficient ratio κ1/κ2 is changed, the normalized threshold gain difference ΔαL greatly changes, which cannot realize stable single mode characteristics.

Figure 6:
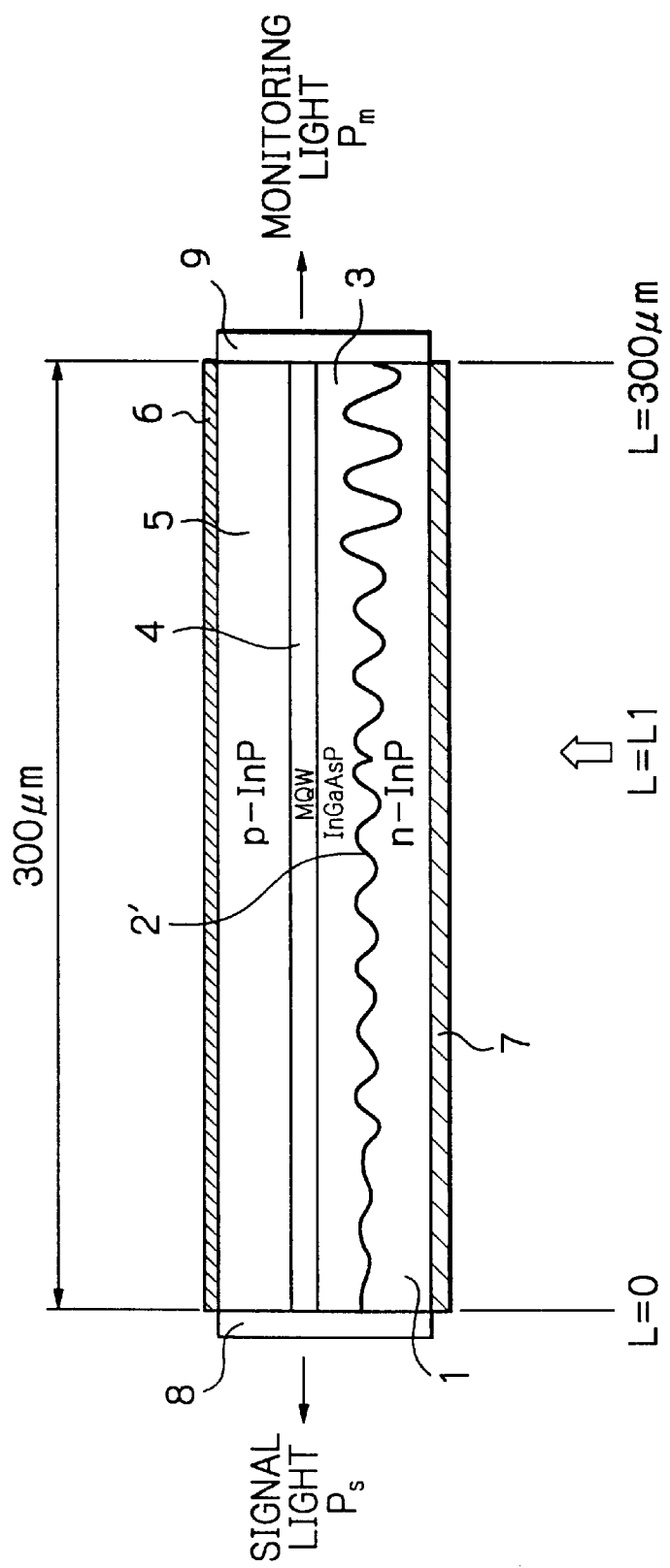
FIG. 6 is a cross-sectional view illustrating a first embodiment of the DFB type semiconductor laser device according to the present invention.

In FIG. 6, which illustrates a first embodiment of the present invention, a diffraction grating 2' is provided instead of the rapid-changed diffraction grating 2 of FIG. 1. That is, the diffraction grating 2' has a coupling coefficient κ which is changed continuously or gradually from κ1 to κ2 as shown in FIG. 7.

Figure 8:
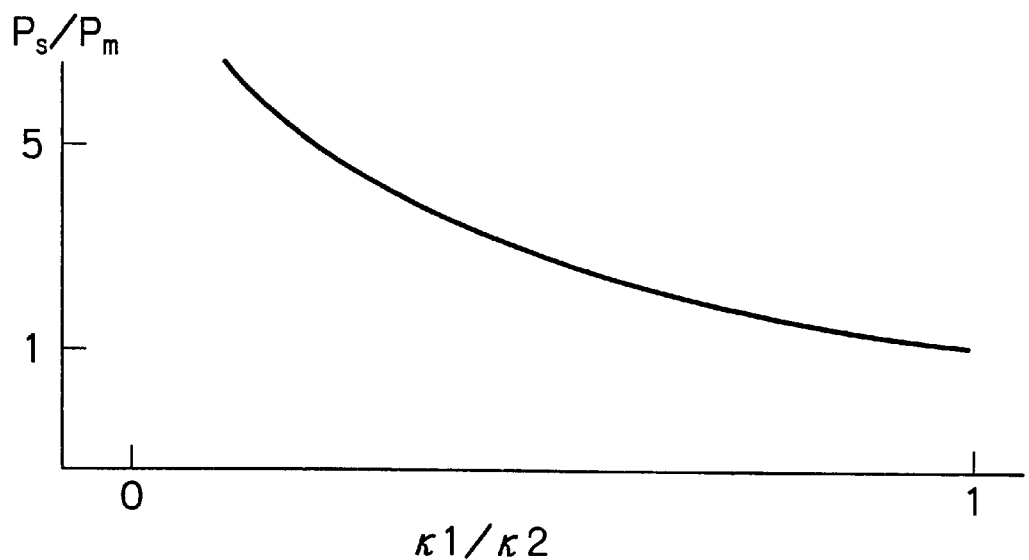
FIG. 8 is a graph showing the relationship between the coupling coefficient ratio and the power output ratio of the device of FIG. 6.

Even in the λ/4-shifted DFB semiconductor laser device of FIG. 6, as shown in FIG. 8, the smaller the ratio of the coupling coefficient κ1 of the region R1 to the coupling coefficient κ2 of the region R2, the larger the ratio of the power $P_s$ of the signal light to the power $P_m$ of the monitoring light.

Figure 9:
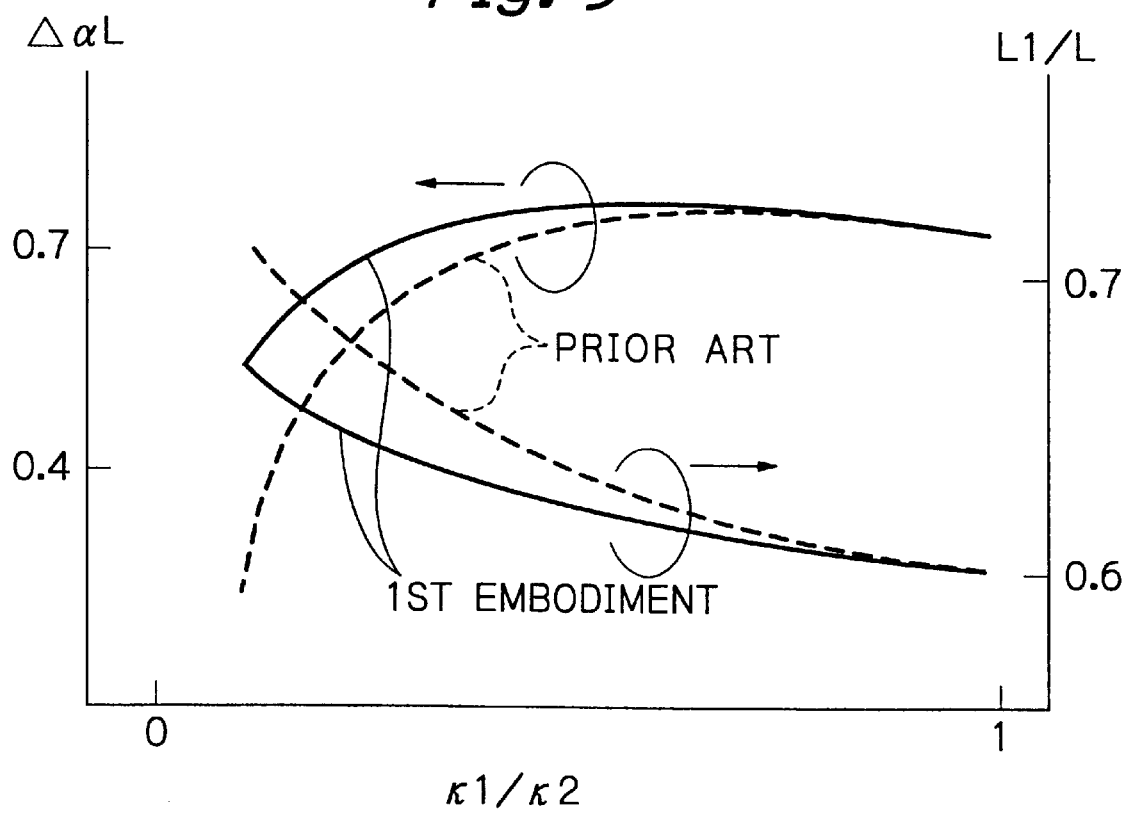
FIG. 9 is a graph showing the normalized threshold gain difference characteristics and the λ/4 shift normalized location characteristics of the device of FIG. 6.

On the other hand, in FIG. 9, which is a graph showing the normalized threshold gain difference ΔαL and the normalized location L1/L of λ/4 shift with respect to the coupling coefficient κ1/κ2 of the device of FIG. 6, when the ratio of the coupling coefficient κ1 of the region R1 to the coupling coefficient κ2 of the region R2 is small, the normalized threshold gain difference ΔαL is larger and the normalized location of the λ/4 shift from the center location of the cavity (L1/L =0.5)is smaller as compared with the prior art λ/4-shifted DFB type semiconductor device of FIG. 1.

Figure 7:
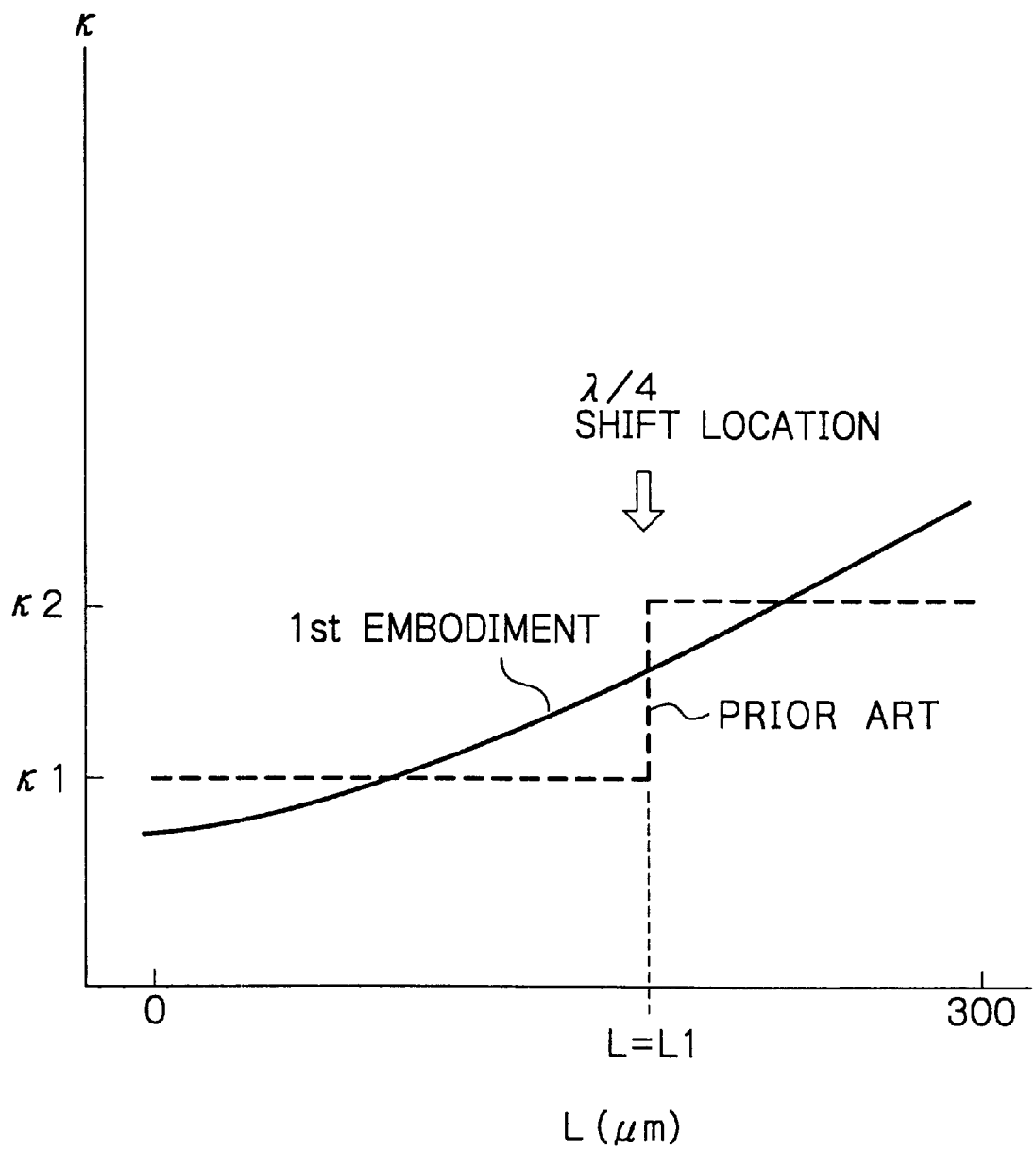
FIG. 7 is a graph showing the coupling coefficient of the device of FIG. 6.

As a result, as shown in FIGS. 8 and 9, the output power ratio $P_s/P_m$ has a loose trade-off relationship with the normalized threshold gain difference ΔαL and the normalized location of the λ/4 shift due to the gradually-changed coupling coefficient κ as shown in FIG. 7. In other words, even if the coupling coefficient ratio κ1/κ2 is small to increase the output power ratio $P_s/P_m$, the normalized threshold gain difference ΔαL is still large and the normalized location of the λ/4 shift is still small, which can realize stable single mode characteristics. For realizing optimum values of the output power ratio $P_s/P_m$, the normalized threshold gain difference ΔαL and the normalized location of the λ/4 shift, a margin or tolerance of the coupling coefficient ratio κ1/κ2 is relatively large. For example, the coupling coefficient ratio κ1/κ2 is approximately ⅕ to ½, which increases the manufacturing yield.

In addition, a gradual change of the diffraction grating 2' at the λ/4 shift location invites a gradual change in the equivalent refractive index of the InGaAsP optical waveguide layer 3, which improves the single mode characteristics.

Further, in a high output mode, the Bragg oscillation condition is not changed by the spatial hole burning phenomenon, so that a mode skip does not occur.

Additionally, as shown in FIG. 10, in the case where the normalized phase shift location L1/L is definite, even when the coupling coefficient ratio κ1/κ2 is changed, the normalized threshold gain difference ΔαL does not greatly change, which can realize stable single mode characteristics.

Although FIGS. 8, 9 and 10 discuss the static characteristics near the laser threshold value, the laser semiconductor device can realize stable single mode characteristics even at a high output operation mode and a high speed modulation operation mode.

The method for manufacturing the device of FIG. 6 will be explained with reference to FIGS. 11A and 11B.

Figure 11A:
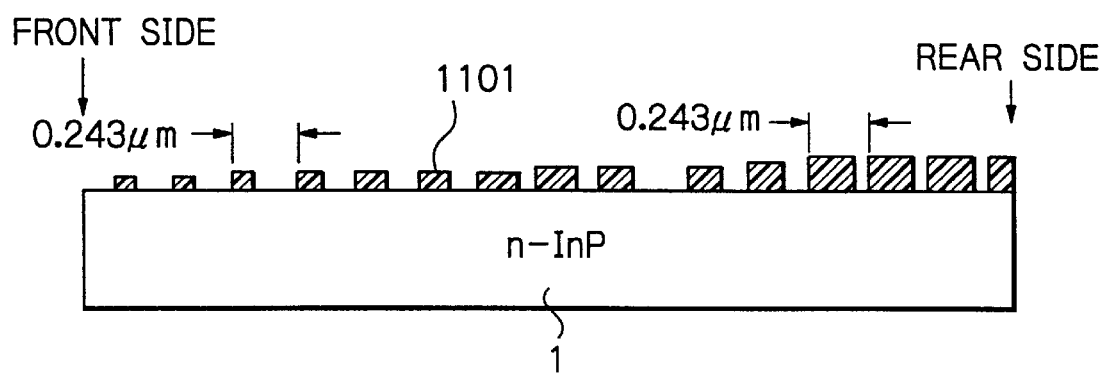
FIGS. 11A and 11B are cross-sectional views for explaining a method for manufacturing the device of FIG. 6.

First, referring to FIG. 11A, an about 150 nm thick positive type electron beam resist layer 1101 is coated on an n-type InP substrate 1, and is patterned by an electron beam exposure process. In this case, the period of apertures of the resist layer 1101 is definite, i.e., 0.24 μm. On bile other hand, the electron dose amount is increased near the front side to decrease the height of the resist layer 1101, while the electron dose amount is decreased near the rear side to increase the height of the resist layer 1101. As a result, the aperture ratio of the apertures is gradually changed, i.e., gradually increased from the front side to the rear side. Then, the InP substrate 1 is etched by HBr/H$_2$O$_2$/H$_2$O etchant using the resist layer 1101 as a mask. Then, the resist layer 1101 is removed.

Note that the InP substrate 1 can be etched by HBr etchant. In this case, since the reaction speed is controlled by the etchant diffusion, the etching speed is low for a region where the device is widely exposed and is high for a region where the device is narrowly exposed. Also, since the relative reaction speed at each crystal surface is controlled by the etchant concentration and the temperature, the etching depth can be accurately controlled.

Figure 11B:
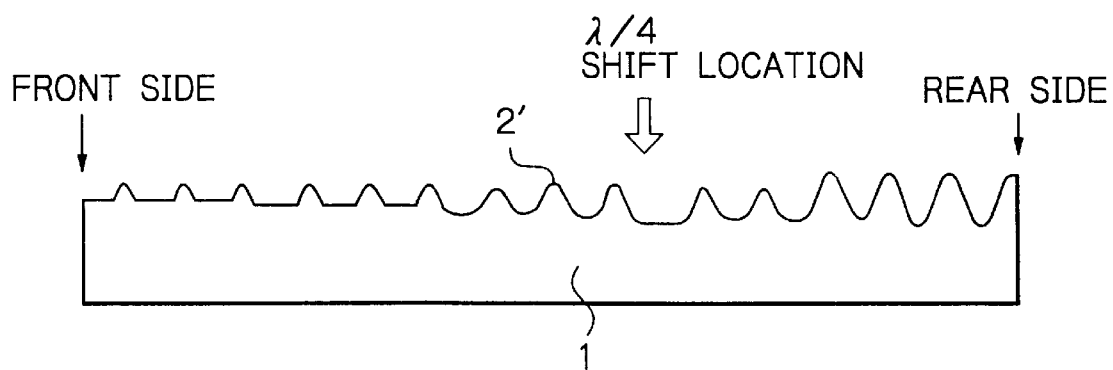

As a result, as illustrated in FIG. 11B, a diffraction grating 2' is formed to have a height which is gradually increased from the front side to the rear side. For example, the height of the diffraction grating 2' is about 10 nm and 90 nm on the front side and the rear side, respectively.

Next, an InGaAsP optical waveguide layer 3 having a band gap wavelength of 1.13 μm, an InGaAsP strained MQW active layer 4 and a p-type InP layer 5 are sequentially deposited by a metalorganic vapor phase epitaxial (MOVPE) process, to form a double heterostructure where the InGaAsP strained MQW active layer 4 is sandwiched by the n-type InP substrate 1 and the p-type InP clad layer 6 which have a large band gap.

Next, the device is etched to form a stripe structure along the <011> direction. Then, a current confinement structure is formed by an MOVPE process.

Next, a p-type electrode 6 and an n-type electrode 7 for injecting a current into the InGaAsP strained active layer 4 are formed on the surfaces of the p-type InP clad layer 6 and the n-type InP substrate 1 by a sputtering process.

Finally, the device is cleaved to a waveguide length of 300 μm. Then, an AR coating 8 is applied on the front side facet, and an AR coating 9 is applied on the rear side facet.

Figure 12:
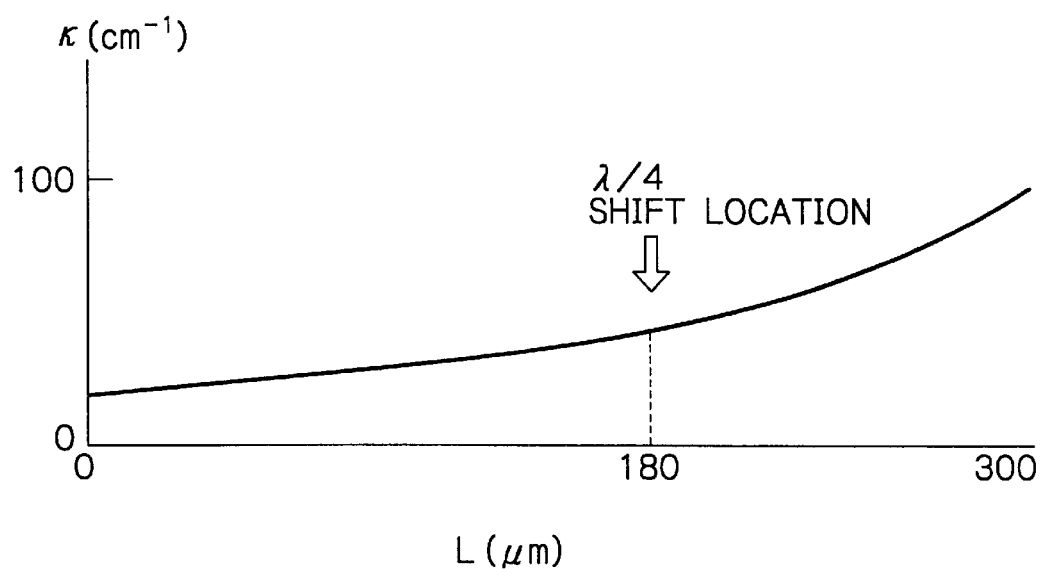
FIG. 12 is a graph showing the coupling coefficient characteristics of the device manufactured by the method as illustrated in FIGS. 11A and 11B.

According to the above-described manufacturing method, a coupling coefficient κ as shown in FIG. 12 was obtained. In this case, the coupling coefficient κ was 10 cm$^{-1}$ on the front side and 100 cm$^{-1}$ on the rear side. Also, a λ/4 shift location was provided at L=180 μm.

Figure 13:
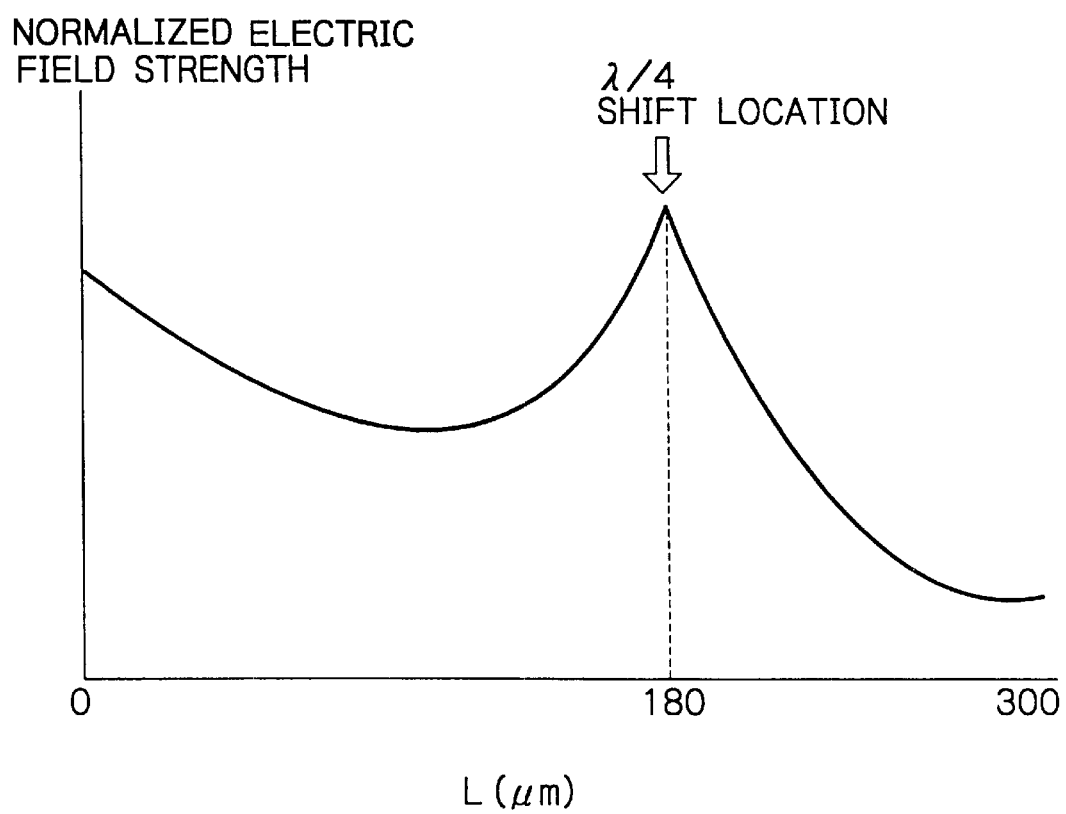
FIG. 13 is a graph showing the normalized electric field profile of the device manufactured by the method as illustrated in FIGS. 11A and 11B.

Also, as shown in FIG. 13, the ratio of the normalized electric field strength at the front side to that at the rear side was about 4. Note that the normalized electric field strength shows the output power of the device. Thus, a normalized threshold gain difference ΔαL of 0.7 or more was obtained.

Further, an oscillation threshold value of 6 mA was obtained, which showed a designed value as the light output characteristics. Also, even when the oscillation is below the oscillation threshold value, an obtained threshold gain difference was equal to or higher than that of the conventional λ/4-shifted DFB semiconductor laser device having a uniform diffraction grating. Thus, stable single mode characteristics were obtained at a high output operation mode and a high speed modulation operation mode.

A modification of the method for manufacturing the device of FIG. 6 will be explained next with reference to FIGS. 14A and 14B.

Figure 14A:
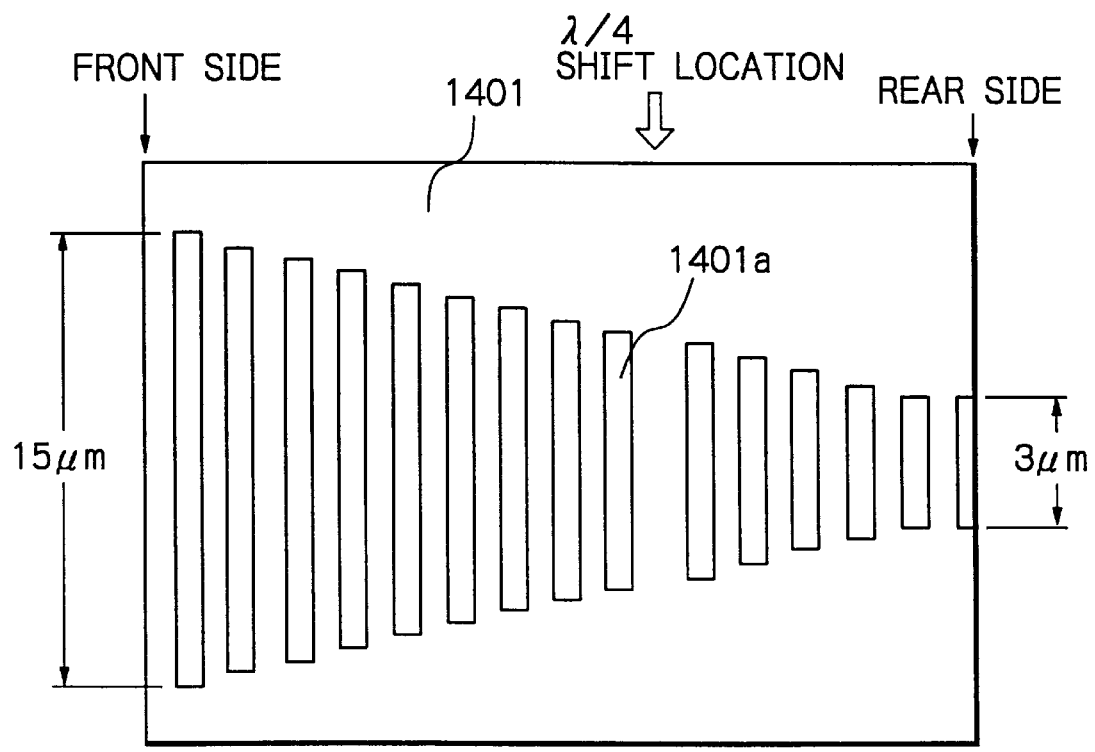
FIGS. 14A and 14B are a plan view and cross-sectional views, respectively, for explaining another method for manufacturing the device of FIG. 6.
Figure 14B:
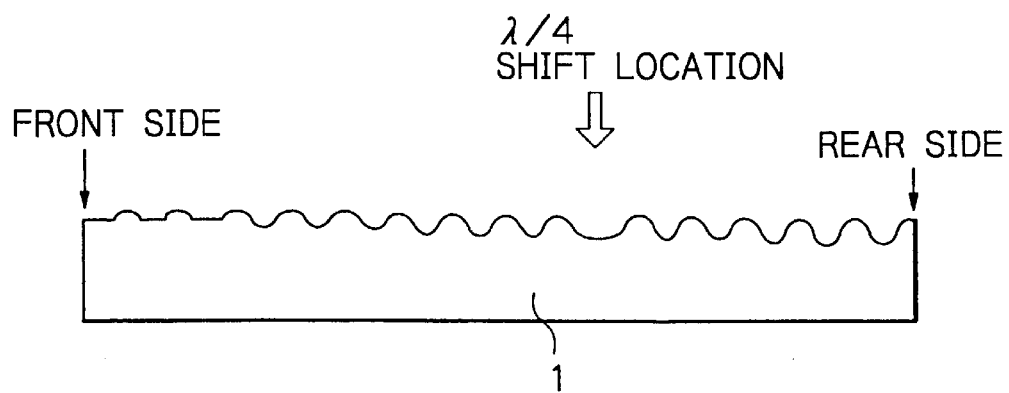

First, referring to FIG. 14A, an about 150 nm thick positive type electron beam resist layer 1401 is coated on an n-type InP substrate 1, and is patterned by an electron beam exposure process. In this case, the period of apertures 1401a of the resist layer 1101 is definite, i.e., 0.243 μm. On the other hand, the width of the apertures 1401a is increased near the front side, while the width of the apertures 1401a is decreased near the rear side. For example, the width of the aperture 1401a at the front side is 15 μm, while the width of the aperture 1401a at the rear side is 3 μm. As a result, the width of the apertures is gradually changed, i.e., gradually increased from the front side to the rear side. Then, the InP substrate 1 is etched by HBr etchant using the resist layer 1401 as a mask. Then, the resist layer 1401 is removed. In this case, since the reaction speed is controlled by the etchant diffusion, the etching speed is low for a region where the device is widely exposed and is high for a region where the device is narrowly exposed. Also, since the relative reaction speed at each crystal surface is controlled by the etchant concentration and the temperature, the etching depth can be accurately controlled.

Note that he formation of the resist layer 1101 as illustrated in FIG. 11A can be combined with the formation of the resist layer 1401 as illustrated in FIG. 14A to form a more-accurately diffraction grating.

Then, the same post-processes are carried out to complete the device of FIG. 6.

In the above-described manufacturing methods, although the InP substrate 1 is etched by using a wet process, a dry etching process can be used. Particularly, when the aperture width is changed by the electron dose amount to differentiate the height of the resist layer 1101 due to the scattering effect and the large proximity effect of electrons as illustrated in FIG. 11A, such a dry etching process can control the height of the diffraction grating 2'.

Figure 15:
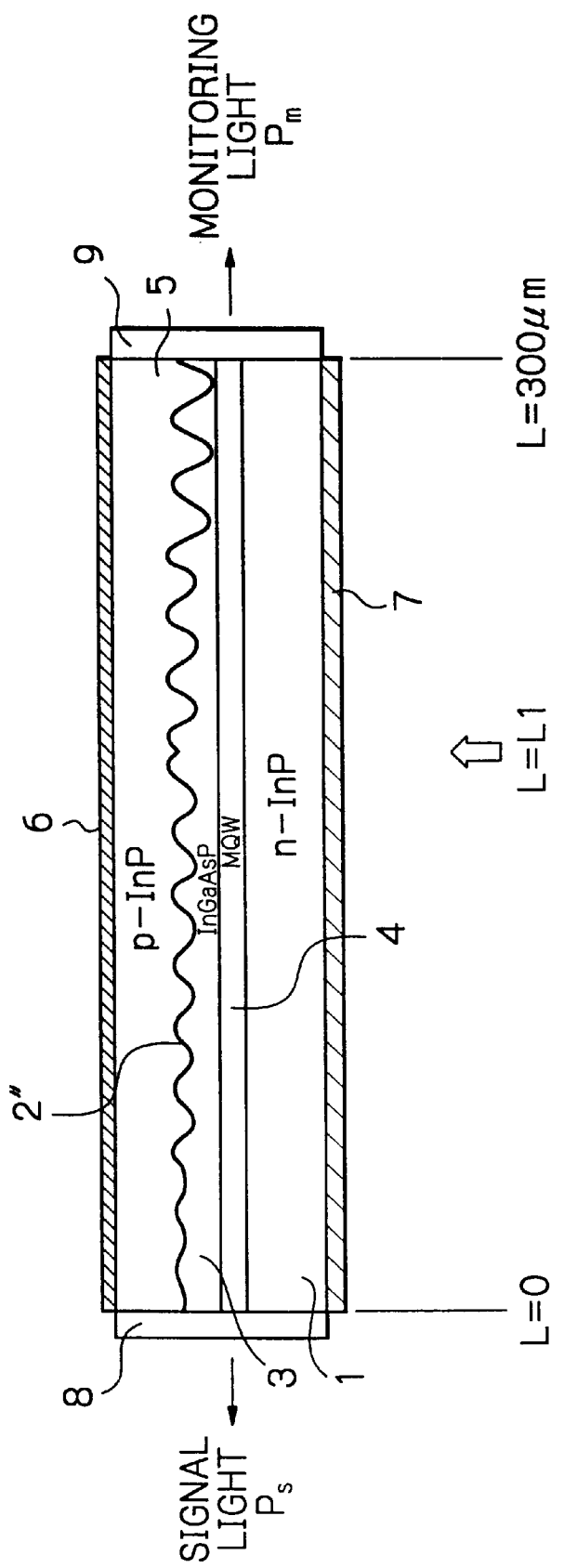
FIG. 15 is a cross-sectional view illustrating a second embodiment of the DFB type semiconductor laser device according to the present invention.
Figure 16:
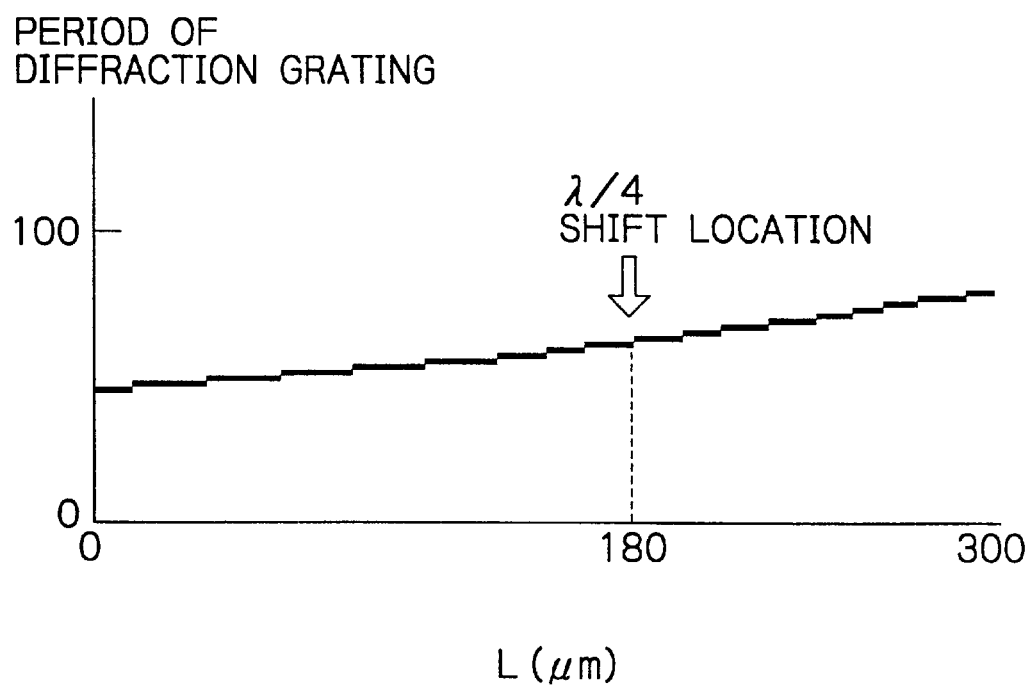
FIG. 16 is a graph showing the period of the period modulation diffraction grating of FIG. 15.

In FIG. 15, which illustrates a second embodiment of the present invention, the InGaAsP optical guide layer 3 of FIG. 6 is formed on the InGaAsP strained active layer 4 of FIG. 6, and also, a period modulation diffraction grating 2" instead of the diffraction grating 2' of FIG. 6 is provided between the InGaAsP optical guide layer 3 and the p-type clad layer 5. The period modulation diffraction grating 2" has a gradually-changed period as shown in FIG. 16. In this case, the coupling coefficient κ is gradually changed as shown in FIG. 7, and a λ/4 shift location is provided at L=180 μm.

The method for manufacturing the period modulation diffraction grating 2" is carried out by the same process as in the first embodiment upon the InGaAsP optical guide layer 3.

In the device of FIG. 15, the thickness of the InGaAsP optical guide layer 3 varies widely in a region where the height of the period modulation diffraction grating 2" greatly varies. As a result, a light confinement configuration changes to change the equivalent refractive index. Since the Bragg wavelength of the DFB type semiconductor laser device depends on the diffraction grating period and the waveguide equivalent refractive index element, a single mode oscillation is not obtained if the Bragg wavelength greatly changes. Therefore, in the second embodiment, as shown in FIG. 16, the period of the period modulation diffraction grating 2" is changed in order to compensate for the change of the equivalent refractive index. That is, since the equivalent refractive index becomes low in a region where the InGaAsP optical guide layer 3 is thinner as the diffraction grating is deeper, the diffraction grating period is made larger to compensate for the decrease of the equivalent refractive index, so that a product between the diffraction grating period and the equivalent refractive index depends at each location is definite.

In the above-described second embodiment, the same characteristics including single mode characteristics as in the first embodiment were obtained.

In the second embodiment, only the structure of the InGaAsP optical guide layer 3 is changed to form the diffraction grating 2" with the modulated period in order to compensate for the change of the equivalent refractive index. However, it is possible to compensate for the change of equivalent refractive index in the same way even in a structure integrating a taper shape at the front side to improve the coupling efficiency to an optical fiber. In this case, only the period of the diffraction grating period formed in the taper shape is changed to compensate for the equivalent refractive index.

When an electro-absorption modulator or an optical coupler is integrated in the DFB type semiconductor laser device by means of a selective growth process, the same effect can be expected even when the equivalent refractive index in a region forming the diffraction grating 2″ is affected by a transition region between the laser element and the modulator or the optical coupler.

Figure 17:
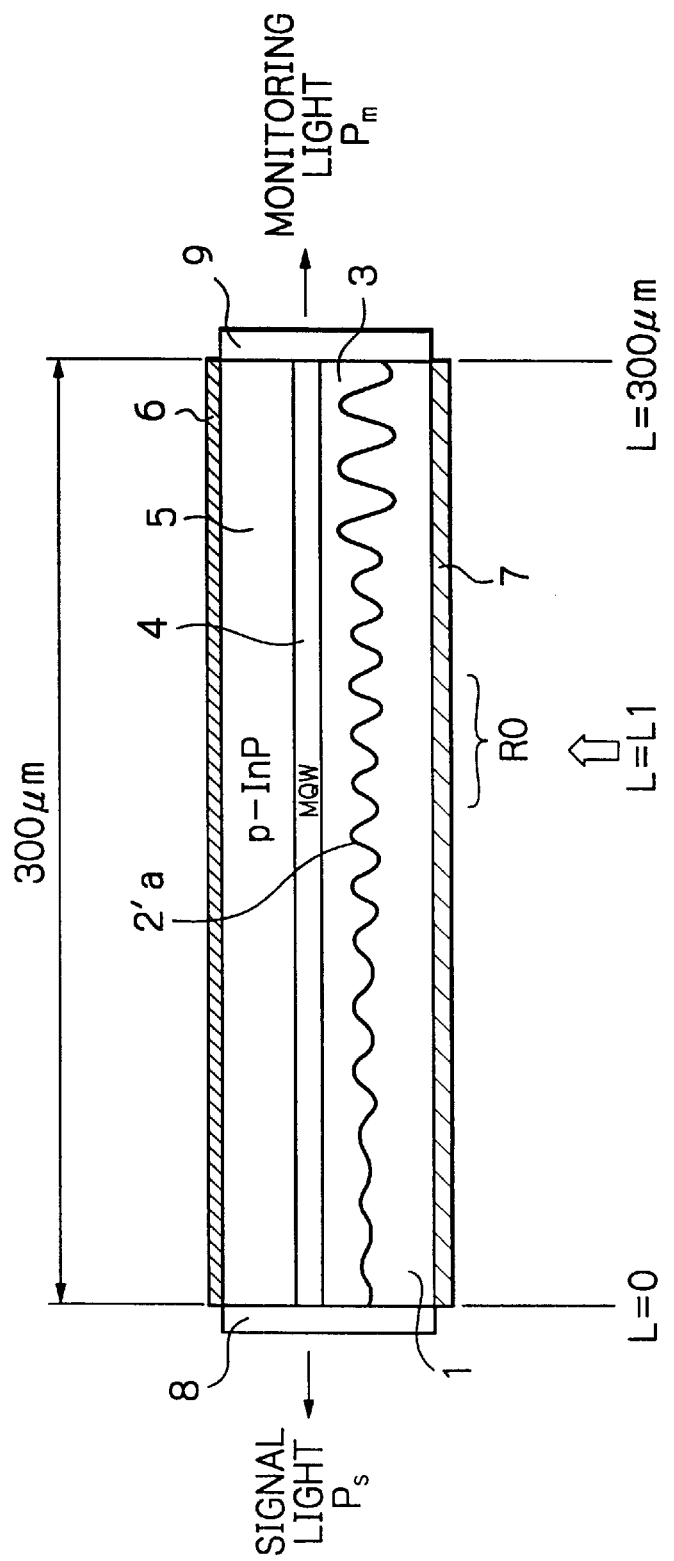
FIG. 17 is a cross-sectional view illustrating a third embodiment of the DFB type semiconductor laser device according to the present invention.

In FIG. 17, which illustrates a third embodiment of the present invention, a period modulation diffraction grating 2′$a$ is provided instead of the diffraction grating 2′ of FIG. 6, in order to compensate for the deviation of the equivalent refractive index where the thickness of the InGaAsP optical guide layer 3 greatly changes.

In the device of FIG. 17, the period modulation diffraction grating 2′$a$ has a phase modulation region R0 around L=L1= 180 $\mu$m.

Figure 18:
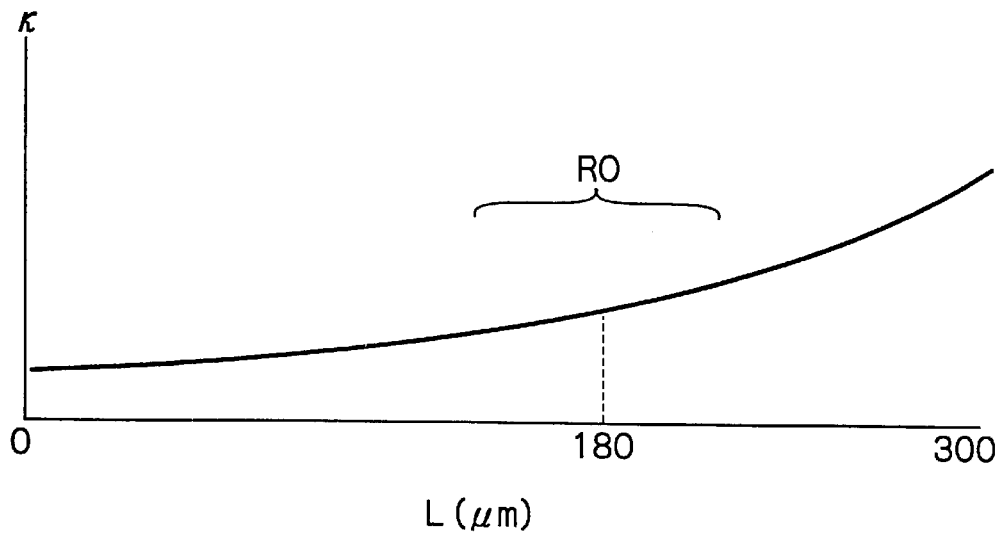
FIG. 18 is a graph showing the coupling coefficient of the device of FIG. 17.
Figure 19:
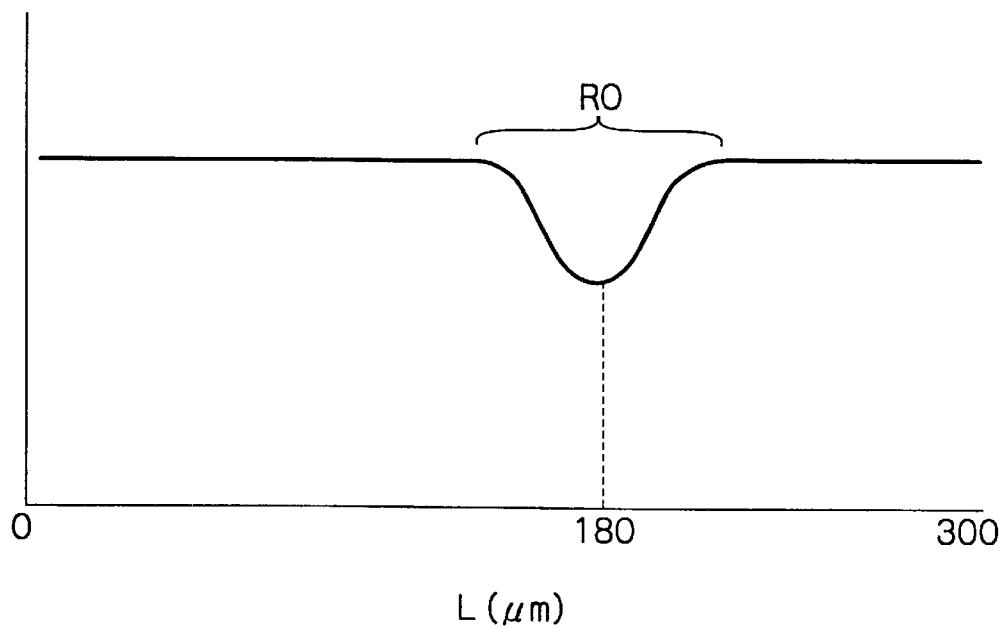
FIG. 19 is a graph showing the period of the period modulation diffraction grating of FIG. 17.

As shown in FIG. 18, the coupling coefficient $\kappa$ gradually increases from the front side to the rear side in the same way as in the first embodiment. Also, as shown in FIG. 19, the period of the diffraction grating 2′$a$ is made shorter in the phase modulation region R0 so that an accumulative phase shift amount that is a sum of phase shift amounts in the phase modulation region R0 is $\lambda/4$. Note that, in order to obtain an oscillation at the Brgg wavelength, i.e., high single mode characteristics, the accumulative phase shift amount is accurately $\lambda/4$ for standing waves in the waveguide. However, actually, since the oscillation wavelength is affected by a slightly shorter period of the phase modulation region R0 of the phase modulation diffraction grating 2′$a$, the accumulative phase shift amount is a value slightly larger than $\lambda/4$.

Figure 20:
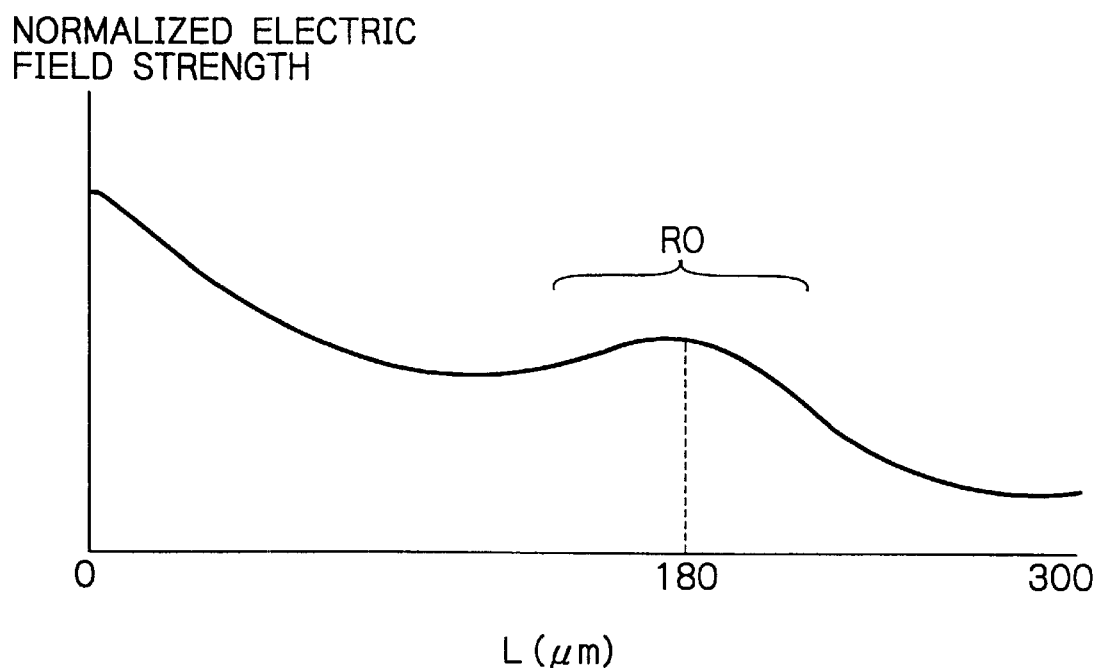
FIG. 20 is a graph showing the normalized electric field profile of the device of FIG. 17.

Also, as shown in FIG. 20, which shows the normalized electric field profile along the axial direction of the waveguide of FIG. 17, since the concentration of the electric field at the center is suppressed as compared with the first embodiment as shown in FIG. 13, stable single mode oscillation characteristics can be obtained in a higher output operation mode. Note that stable single mode oscillation characteristics were obtained under a long-haul transmission test in a 2.5 Gbit/sec direct modulation operation mode, and the fluctuation of the characteristics of each device was small with a high manufacturing yield.

The method for manufacturing the period modulation diffraction grating 2′$a$ is carried out by the same process as in the first embodiment.

In the third embodiment, although the accumulative phase shift amount in the phase modulation region R0 is $\lambda/4$ (½ of the diffraction grating period), the accumulative phase shift amount can be 3$\lambda/4$ (⅔ of the diffraction grating period), 5$\lambda/4$ (⅝) of the diffraction grating period or the like. That is, the accumulative phase shift amount is +(2n−1)/2 of the period of the diffraction grating 2′$a$ where n is a natural number. Concretely, the absolute value of the accumulative phase shift amount in the phase modulation region R0 is preferably from ½ to 9/2 of the diffraction grating period. In addition, in order to obtain stable single mode characteristics with a high manufacturing yield, the phase modulation region R0 of the diffraction grating 2′$a$ is preferably 1/10 to ⅓ of the waveguide length.

As explained hereinabove, according Lo the present invention. The allowable range of a coupling coefficient can be increased to obtain single mode characteristics and high output characteristics. Also, the manufacturing yield of devices can be enhanced. Further, even when the equivalent refractive index of a waveguide varies, the deterioration of single mode characteristics can be avoided. Still further, a mode skip due to the Bragg oscillation condition under the influence of the hole burning phenomenon in a high output operation mode can be avoided.

What is claimed is:

1. A distributed feedback type semiconductor laser device having a waveguide structure for outputting a signal light from a front side of said waveguide structure and a monitoring light from a rear side of said waveguide structure, comprising:

a semiconductor substrate;

an active layer formed above said semiconductor substrate, said active layer having a constant width; and an optical guide layer formed above said active layer and having a diffraction grating thereon, a coupling coefficient of said waveguide structure being gradually increased form the front side of said waveguide structure to the rear side of said waveguide structure.

2. The device as set forth in claim 1, wherein a phase shift is provided at a location of said diffraction grating on the rear side of said waveguide structure from a center of said waveguide structure.

3. The device as set forth in claim 1, wherein a phase shift amount of said phase shift is $\lambda/4$ where $\lambda$ is twice a period of said diffraction grating multiplied by an equivalent refractive index of said waveguide structure.

4. The device as set forth in claim 1, wherein said optical guide layer is sandwiched by said semiconductor substrate and said active layer, said diffraction grating being formed at an interface between said semiconductor substrate and said optical guide layer.

5. The device as set forth in claim 1, wherein said active layer is formed on said semiconductor substrate, said optical guide layer being formed on said active layer, said device further comprising a clad layer formed on said optical guide layer, said diffraction grating being formed at an interface between said optical guide layer and said clad layer.

6. The device as set forth in claim 1, further comprising:

a first anti-reflection layer formed on the front side of said waveguide structure; and a second anti-reflection layer formed on the rear side of said waveguide structure.

7. The device as set forth in claim 1, wherein a period of said diffraction grating is determined so that a product between the period of said diffraction grating and an equivalent refractive index of said waveguide structure is definite.

8. The device as set forth in claim 1, wherein a mean value $\kappa1$ of said coupling coefficient on the front side of said waveguide structure and a mean value $\kappa2$ of said coupling coefficient on the rear side of said waveguide structure satisfy:

$$\frac{1}{5} \leq \kappa1/\kappa2 \leq \frac{1}{2}.$$

9. The device as set forth in claim 1, wherein said diffraction grating has a phase modulation region on the rear side of said waveguide structure from the center of said waveguide structure.

10. The device as set forth in claim 9, wherein an accumulative phase shift amount of said phase modulation region is a quarter of a wavelength of said waveguide structure, wherein said wavelength is twice a period of said diffraction grating multiplied by an equivalent refractive index of said waveguide structure.

11. The device as set forth in claim 9, wherein said phase modulation region has a length of 1/10 to 1/3 of said waveguide structure.

12. The device as set forth in claim 9, wherein an absolute value of an accumulative phase shift amount of said phase modulation region is $\pm(2n-1)/2$ of the period of said diffraction grating where n is a natural number.

* * * * *